United States Patent
Kim et al.

(10) Patent No.: US 10,573,575 B2
(45) Date of Patent: Feb. 25, 2020

(54) SEMICONDUCTOR PACKAGE WITH THERMAL FINS

(71) Applicant: Intel Corporation, Santa Clara, CA (US)

(72) Inventors: Hyoung Il Kim, Folsom, CA (US); Florence Pon, Folsom, CA (US); Yi Xu, Folsom, CA (US); Yuhong Cai, Folsom, CA (US); Min-Tih Lai, Kirkland, WA (US); Leo Craft, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 15/688,662

(22) Filed: Aug. 28, 2017

(65) Prior Publication Data
US 2019/0067156 A1  Feb. 28, 2019

(51) Int. Cl.
*H01L 23/34* (2006.01)
*H01L 23/367* (2006.01)
*H01L 23/055* (2006.01)
*H01L 23/14* (2006.01)
*H01L 25/065* (2006.01)

(52) U.S. Cl.
CPC ........ *H01L 23/3677* (2013.01); *H01L 23/055* (2013.01); *H01L 23/14* (2013.01); *H01L 23/34* (2013.01); *H01L 23/3675* (2013.01); *H01L 25/0657* (2013.01); *H01L 2224/16145* (2013.01); *H01L 2224/16227* (2013.01); *H01L 2224/16235* (2013.01); *H01L 2224/32145* (2013.01); *H01L 2225/06589* (2013.01); *H01L 2924/10253* (2013.01); *H01L 2924/10271* (2013.01)

(58) Field of Classification Search
CPC . F28D 15/0266; F28D 15/0275; H01L 35/00; H01L 35/30
See application file for complete search history.

(56) References Cited

U.S. PATENT DOCUMENTS

2003/0011053 A1* 1/2003 Yasunaga ............ H01L 23/3128
257/678
2009/0026605 A1* 1/2009 Gupta ................. H01L 23/3677
257/712

(Continued)

*Primary Examiner* — Meiya Li
(74) *Attorney, Agent, or Firm* — Schwabe, Williamson & Wyatt, P.C.

(57) ABSTRACT

Embodiments of the present disclosure provide techniques and configurations for a semiconductor package with thermal fins, in accordance with some embodiments. In embodiments, a package assembly includes a die and a mold compound disposed on the die, to encapsulate the die. The package may further include a thermal solution including one or more thermal fins attached to the mold compound at their respective ends. The thermal fins may be disposed substantially flat on a top surface of the mold compound at a first temperature, and rise away from the top surface of the mold compound in response to a change of temperature to a second temperature, to reach an enclosure that surrounds the package assembly, to provide direct heat conductivity between the die and the enclosure. The second temperature may be greater than the first temperature. Other embodiments may be described and/or claimed.

24 Claims, 7 Drawing Sheets

(56) References Cited

U.S. PATENT DOCUMENTS

2013/0078765 A1* 3/2013 Lin .................. H01L 21/76898
 438/107
2014/0360699 A1* 12/2014 van Schoor ............. F28F 13/06
 165/96
2018/0017345 A1* 1/2018 Poltorak ................. F28F 13/06

* cited by examiner

US 10,573,575 B2

SEMICONDUCTOR PACKAGE WITH THERMAL FINS

FIELD

Embodiments of the present disclosure generally relate to the field of semiconductor package fabrication and in particular to thermal management for semiconductor packages.

BACKGROUND

Currently produced computing systems, comprising semiconductor packages demand higher power due to an increase in core counts, performance, and integration of multiple dies. This high power may translate to higher heat density on the dies and packages and require better thermal solutions to cool them. Devices based on a system in package (SiP) may suffer from thermal management problems because power-hungry application-specific integrated circuits (ASIC) may be stacked with thermally sensitive devices, such as dynamic random-access memory devices (DRAM) or NOT-AND (NAND).

It may be difficult to use bulky heat sinks or heat spreaders in SiP-based devices due to inherent limitations to Z-height of the device. Further, it may be difficult to use thermal slug solutions in SiP-based devices, particularly in packages with wirebond connection on the top of package. Also, a thermal slug solution may create undesirable package warpage and delamination problem in SiP-based devices.

In many cases, SiP-based devices may require a provision of a thermal interface material (TIM) between SiP and enclosures (i.e. phone case, laptop back cover or screen) for effective thermal dissipation. TIM thickness may be critical in order to provide good contact. For example, TIM may not sufficiently conduct heat out when it is too thin and may leave a gap between interfaces. Conversely, thick TIM may cause early mechanical reliability issues by adding extra pressure onto the package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for a semiconductor package with a thermal solution comprising thermal fins, in accordance with some embodiments. In embodiments, a semiconductor package assembly may comprise a die and a mold compound disposed on the die, to encapsulate the die. The package may further include a thermal solution comprising one or more thermal fins attached to the mold compound at their respective ends. The thermal fins may be disposed substantially flat on a top surface of the mold compound at a first temperature, and rise away from the top surface of the mold compound in response to a temperature change to a second temperature, to reach an enclosure that surrounds the package assembly, to provide direct heat conductivity between the die and the enclosure. The second temperature may be greater than the first temperature.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
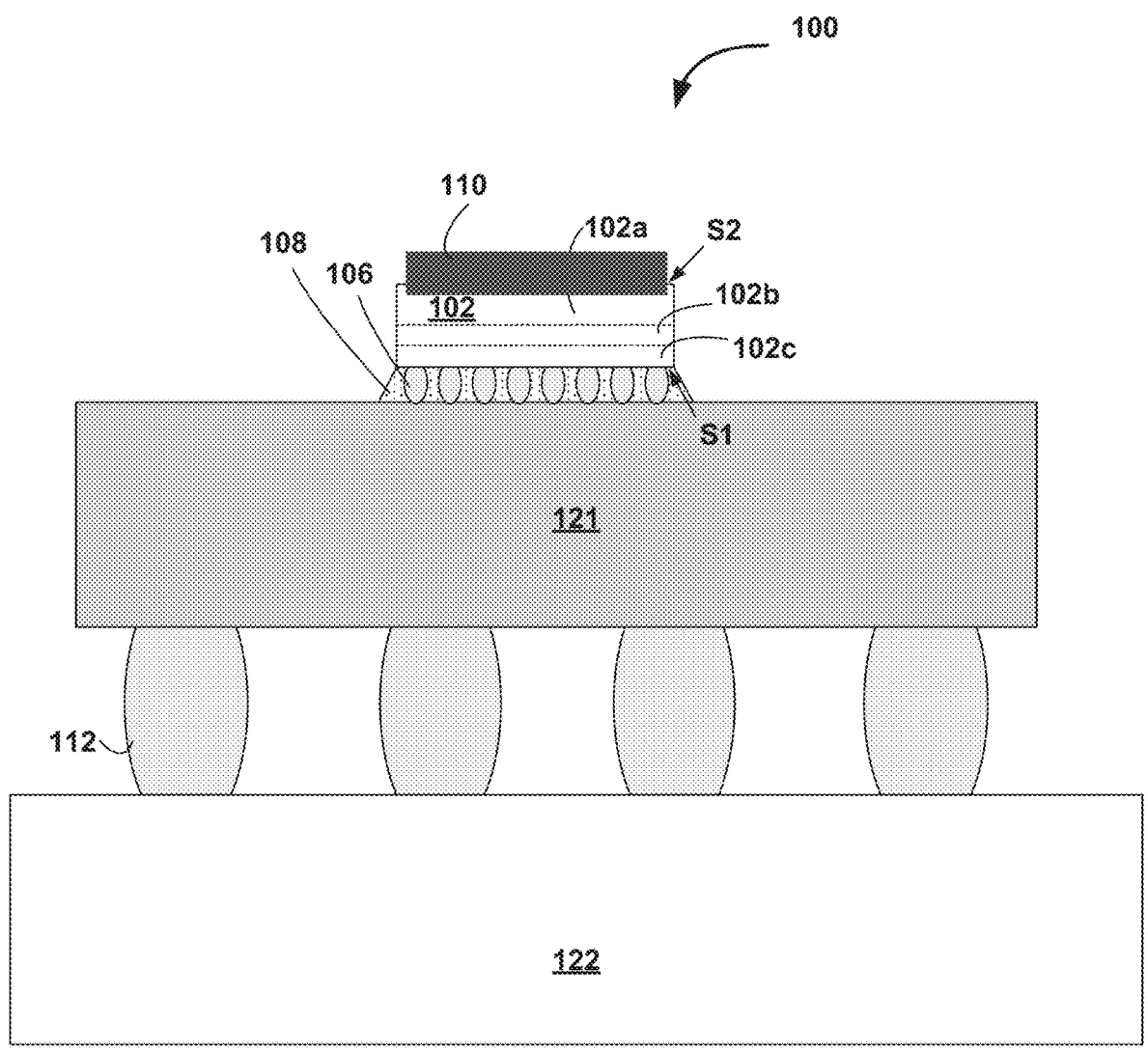
FIG. 1 schematically illustrates a cross-section side view of an example integrated circuit (IC) assembly with a thermal solution, in accordance with some embodiments.

FIG. 1 schematically illustrates a cross-section side view of an example integrated circuit (IC) assembly with a thermal solution, in accordance with some embodiments. In some embodiments, the IC assembly 100 may comprise a semiconductor package device, for example an integrated circuit (IC), such as a central processing unit (CPU) or a memory unit, and may further comprise a portion of a computing device, such as a graphics device, wireless device, multi-chip package including a combination with other devices, or the like.

In some embodiments, the IC assembly 100 may include one or more dies (hereinafter "die 102") electrically and/or physically coupled with a package assembly 121 (sometimes referred to as a "package substrate"). In some embodiments, the package assembly 121 may be electrically coupled with a circuit board 122.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a radio frequency (RF) die. In other embodiments, the die may be, include, or be a part of a processor, memory, system-on-chip (SoC), SiP, or ASIC.

In some embodiments, an underfill material 108 (sometimes referred to as an "encapsulant") may be disposed between the die 102 and the package assembly 121 to promote adhesion and/or protect features of the die 102 and the package assembly 121. The underfill material 108 may be composed of an electrically insulative material and may encapsulate at least a portion of the die 102 and/or the die-level interconnect structures 106. In some embodiments, the underfill material 108 may be in direct contact with the die-level interconnect structures 106.

The die 102 can be attached to the package assembly 121 according to a wide variety of suitable configurations including, for example, being directly coupled with the package assembly 121 in a flip-chip configuration, as depicted. In the flip-chip configuration, an active side, S1, of the die 102 including active circuitry is attached to a surface of the package assembly 121 using die-level interconnect structures 106 such as bumps, pillars, or other suitable structures that may also electrically couple the die 102 with the package assembly 121. The active side S1 of the die 102 may include transistor devices, and an inactive side, S2, may be disposed opposite to the active side S1. In some embodiments, a thermal solution 110 according to embodiments described herein may be disposed on the inactive side S2. The thermal solution 110 may comprise thermal fins and will be described below in greater detail.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package assembly 121 may include a multi-layer package assembly with integrated components for wireless communication. The wireless communication may include, for example, short range wireless data transfer between portable devices and/or wireless displays or high speed wireless communication between peer devices.

The package assembly 121 may include electrical routing features (not shown in FIG. 1) such as, for example, traces, pads, through-holes, vias, or lines configured to route electrical signals to or from the die 102. For example, the package assembly 121 may be configured to route electrical signals between the die 102 and components for wireless communication that are integrated within the package assembly, or between the die 102 and the circuit board 122, or between the die 102 and another electrical component (e.g., another die, interposer, interface, component for wireless communication, etc.) coupled with the package assembly 121.

The circuit board 122 may be a printed circuit board (PCB) composed of an electrically insulative material such as an epoxy laminate. For example, the circuit board 122 may include electrically insulating layers composed of materials, such as polytetrafluoroethylene, phenolic cotton paper materials such as Flame Retardant 4 (FR-4), FR-1, cotton paper, and composite epoxy materials (CEM) such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 may be a motherboard or other PCB in a computing device (e.g., described in reference to FIG. 8).

Package-level interconnects, such as solder balls 112, may be coupled with the package assembly 121 and/or the circuit board 122 to form corresponding solder joints that are configured to further route the electrical signals between the package assembly 121 and the circuit board 122. Other suitable techniques to physically and/or electrically couple the package assembly 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

Figure 2:
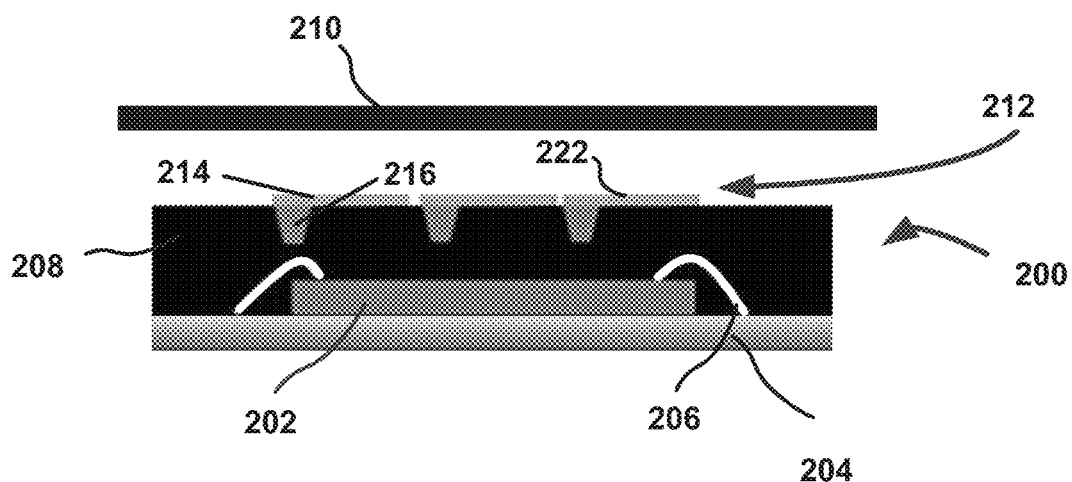
FIGS. 2-3 illustrate some aspects of an example package assembly with a thermal solution comprising thermal fins, in accordance with some embodiments.
Figure 3:
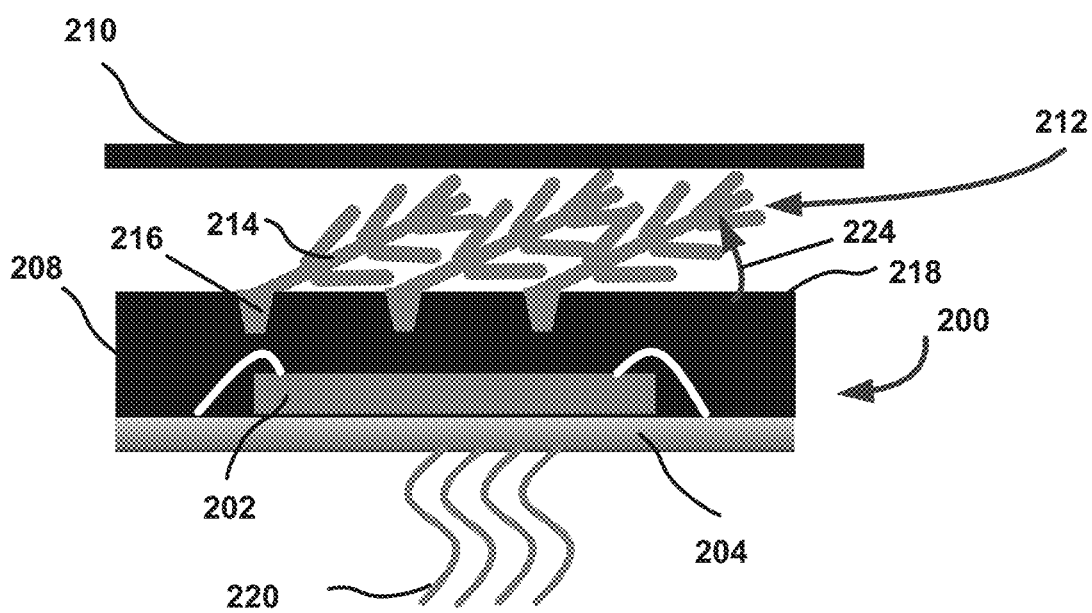

FIGS. 2-3 illustrate some aspects of an example package assembly with a thermal solution comprising thermal fins, in accordance with some embodiments. Some of the components of the package assembly 200 may be provided according to the embodiments described in reference to FIG. 1.

In embodiments, the package assembly 200 may include a die 202 disposed on a substrate 204. The die 202 may be electrically coupled with the substrate 204 in a number of different ways. For example, the die 202 may be electrically coupled with the substrate 204 with a wirebond 206. The package assembly 200 may further include a mold compound 208 disposed on the die 202, to encapsulate the die 202.

In embodiments, the package assembly 200 may be disposed inside, or in proximity to, at least a portion of an enclosure 210. In embodiments, the enclosure 210 may comprise a metal or other heat conducting material. In some embodiments, the enclosure 210 may surround, at least partially, the package assembly 200. In embodiments, the enclosure 210 may comprise a metal or graphite layer disposed in proximity to the package assembly 200 as shown in FIGS. 2-3. The enclosure 210 may be, for example, a heat sink, a heat spreader, a casing of a mobile device or tablet computer, or the like.

In embodiments, the package assembly 200 may include a thermal solution 212, to provide heat dissipation for the package assembly. The thermal solution 212 may comprise one or more thermal fins 214 attached to the mold compound 208 at their ends 216. In embodiments, the thermal fins 214 may comprise bi-metal, tri-metal, or shape memory alloy. The examples of bi-metal or tri-metal materials that may be used for thermal fins manufacture may include combinations between tungsten, titanium, and/or copper. In some embodiments, silicon may be used. The examples of shape memory alloys may include Ag—Cd, Au—Cd, Cu—Sn, Cu—Zn, Fe—Pt, Fe—Mn—Si, Co—Ni—Ga, Ni—Fe—Ga, Ti—Nb, Ni—Ti, and other combinations. The thermal fins 214 may be patterned and anchored directly onto the top of the package encapsulation surface 218 (e.g., top surface of the mold compound 208) using plating or sputtering technique.

In embodiments, the thermal fins 214 may be disposed in a substantially flat position 222 on the top surface 218 of the mold compound 208 at a first temperature (e.g., room temperature).

As shown in FIG. 3, the fins 214 may rise away from its flat position 222 on the top surface 218 of the mold compound 208 in response to a temperature change, as indicated by arrow in FIG. 3. For example the ambient or package temperature may change (e.g., increase) due to heating 220 of the die 202 to a second temperature value. The second temperature value may be greater than the first temperature value. Accordingly, the position of the thermals fins 214 may change from a flat position 222 to a risen position 224 in response to a temperature change. In embodiments, first temperature may be room temperature, and second temperature may be operating temperature of the device, and may range from 50 to 200 degrees C., depending on an application.

The position of the thermal fins 214 may change from 222 to 224, for example, due to a coefficient of thermal expansion mismatch between two different materials, in bi-metal implementation. In another example, the position of the thermal fins 214 may change from 222 to 224 if the fins 214 comprise a shape memory alloy. As known, an item manufactured from a shape memory alloy remembers its original shape, e.g., it returns to the original state although it may be mechanically deformed.

Accordingly, thermal fins 214 may be disposed substantially flat on the surface 218 during the system assembly, and rise up and directly contact with enclosure 210 without a need of additional TIM used in legacy solutions, in which TIM may be provided between a SiP and an enclosure.

In summary, when the fins 214 rise away from the top surface 218 of the mold compound 208, they may reach, and establish a direct physical contact with, the enclosure 210. Accordingly, the fins 214, in their risen position, may provide direct heat conductivity between the die 202 and the enclosure 210, and thus provide efficient dissipation of heat produced by an integrated circuit (e.g., CPU) comprising the die 202. A desired risen position 224 of the thermal fins 214 and triggering temperature may be provided by appropriate selection of a material for the fins 214 and thickness control of the mold compound 208.

In some embodiments, a raised fin in and of itself may provide good thermal convection and may act as a heat sink under forced air cooling systems due to increased surface area. In such embodiments, the raised fins may not need to directly touch the enclosure 210 because the enclosure may not be needed in some applications.

Figure 4:
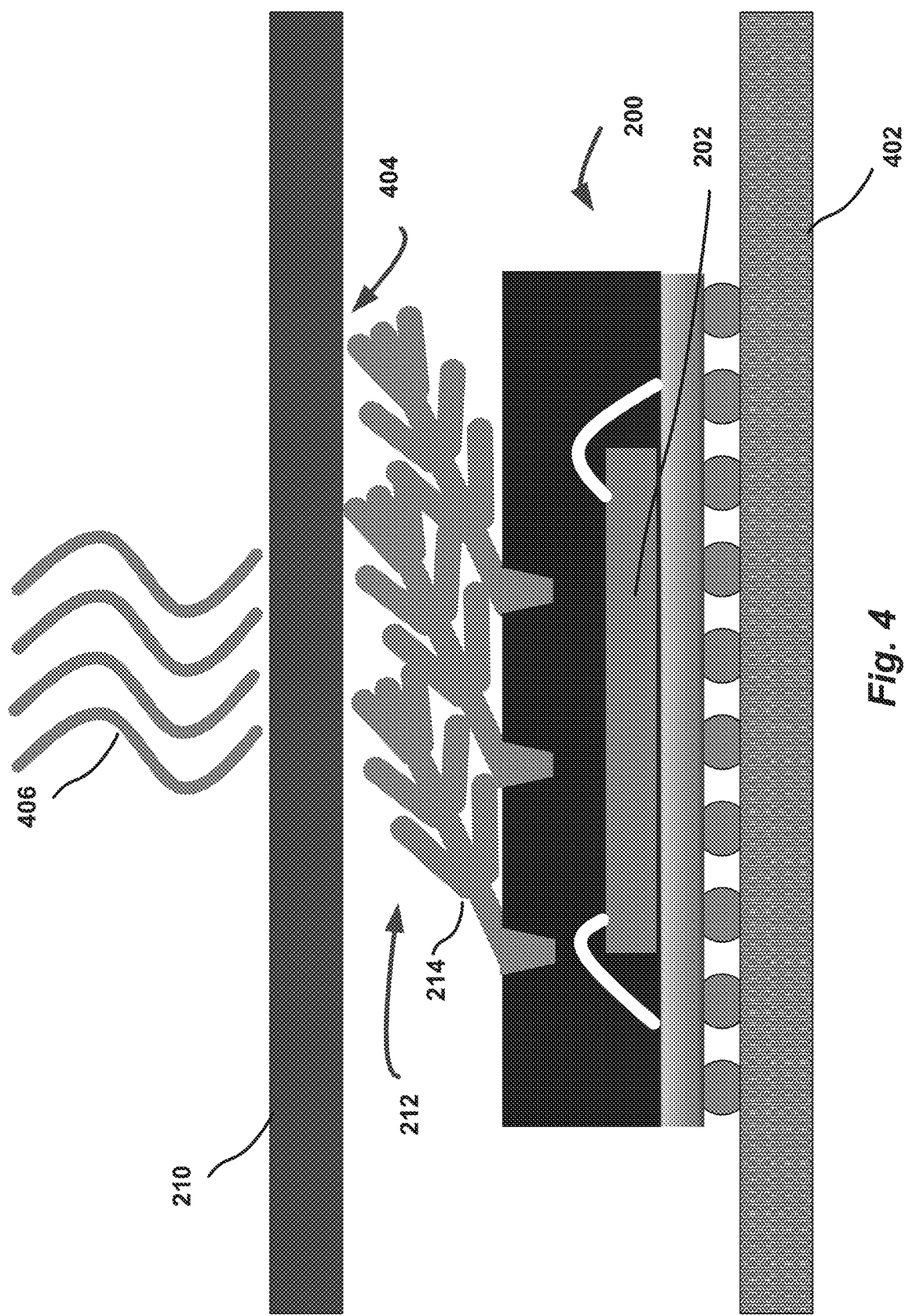
FIG. 4 is an example side view of the package assembly with a thermal solution comprising thermal fins, in accordance with some embodiments.

FIG. 4 is an example side view of the package assembly with a thermal solution, in accordance with some embodiments. For ease of understanding, like components of FIGS. 2-4 are indicated by like numerals.

As shown, the package assembly 200 with the thermal solution 212 may be attached to a PCB (e.g., motherboard) 402. In a risen position, thermal fins 214 may provide a direct contact 404 with the enclosure 210. Accordingly, the heat 406 may be directly conducted through the enclosure 210 away from the die 202.

Figure 5:
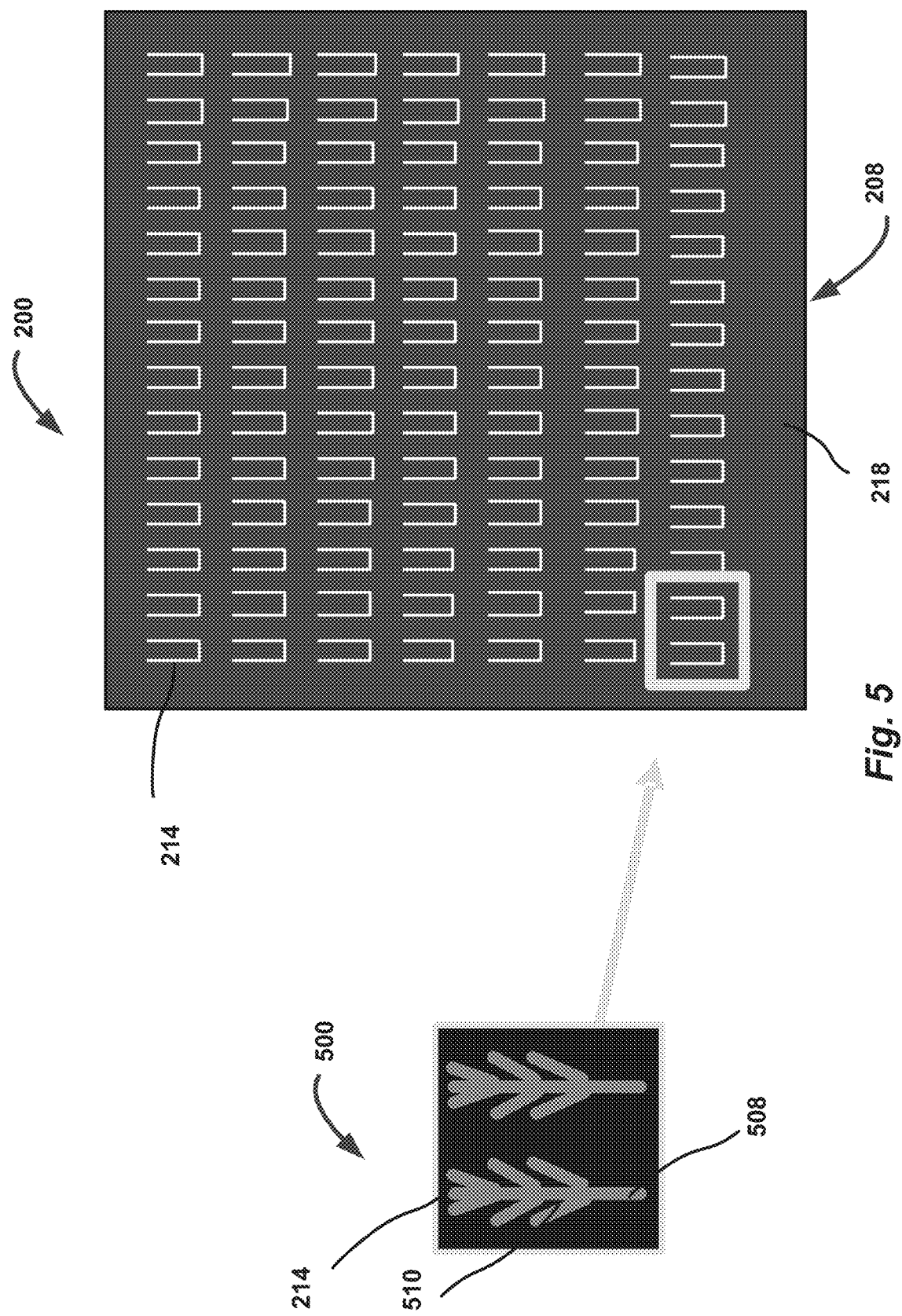
FIG. 5 illustrates an example top view of the thermal fins pattern on a surface of a mold compound of the package assembly of FIGS. 1-4, in accordance with some embodiments.

FIG. 5 illustrates an example top view of the thermal fins pattern on a surface of a mold compound of the package assembly of FIGS. 1-4, in accordance with some embodiments. For ease of understanding, like components of FIGS. 2-5 are indicated by like numerals.

As shown, the thermal fins 214 may be disposed in a row-column pattern on a top surface 218 of the mold compound 208 of the package assembly 200. However, different patterns of thermal fins arrangement on the mold compound 208 may be contemplated.

The blown up view 500 of a portion of the thermal fins pattern illustrates example configurations of thermal fins 214 in detail. In embodiments, thermal fins 214 may take different shapes, in order to optimize (maximize) heat conduction. For example, the fins 214 may have a tree-like shape, such as include a stem 508 and a plurality of branches 510 extending out of the stem 508 on each side of the stem, as shown. The example shape of the thermal fins 214 may be provided to optimize a surface of heat conduction for the fins. The example shape shown in view 500 does not limit the present disclosure and is provided for purposes of illustration. For example, the thermal fins 214 may include a coiled shape, and may raise like a conical spring. In another example, a thermal fin 214 may comprise a multi-directional fin, e.g., it may not have to aligned in one direction, and may lay out in multiple directions. Fin length may vary, e.g., be small in center, and long in edges to mitigate warpage issues. In general, different thermal fins' shapes and arrangement patterns aimed at optimizing heat conduction may be contemplated and may be optimized to different applications.

Figure 6:
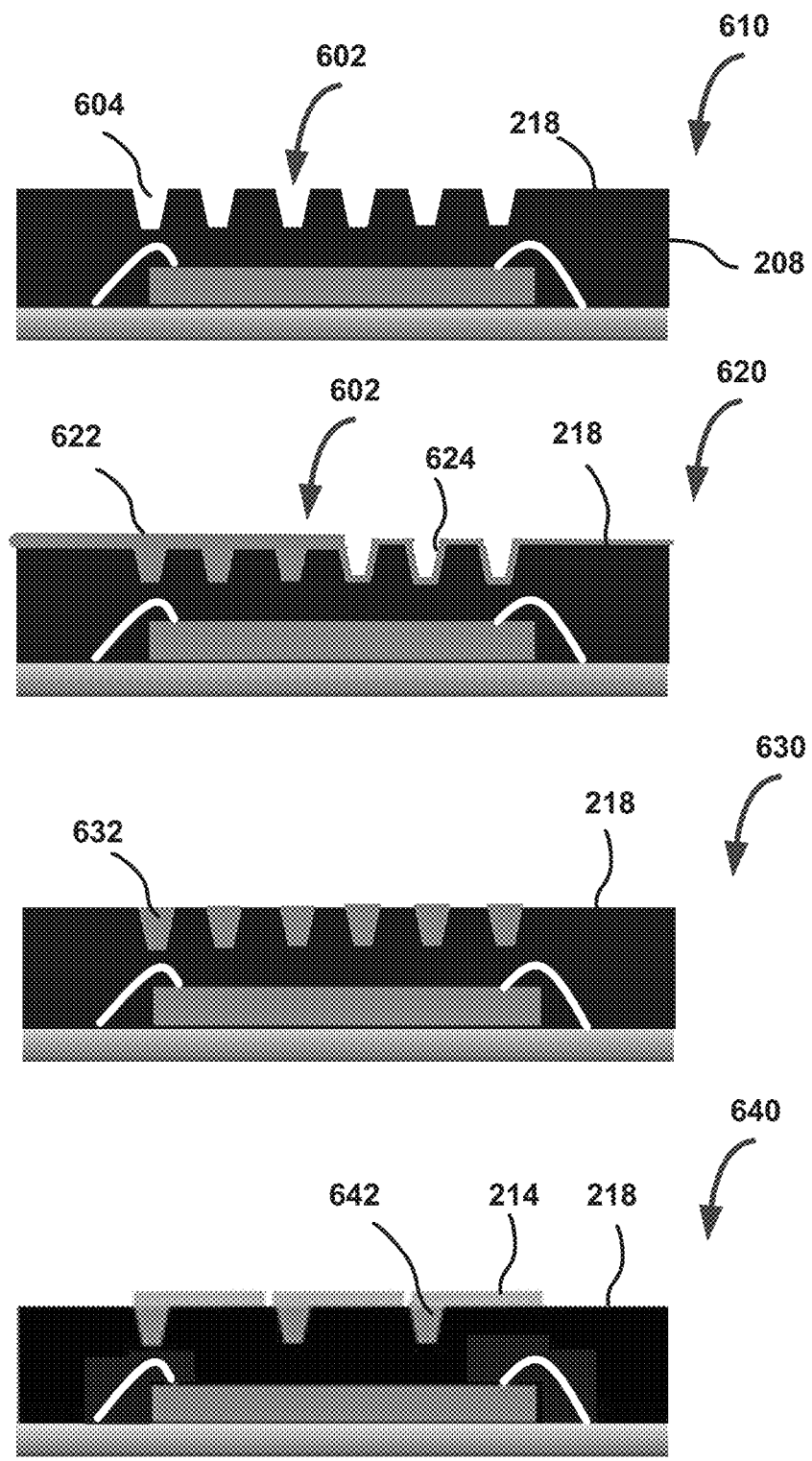
FIG. 6 illustrates side views of an example package assembly with a thermal solution comprising thermal fins in different stages of assembly, in accordance with some embodiments.

FIG. 6 illustrates side views of an example package assembly with a thermal solution comprising thermal fins in different stages of assembly, in accordance with some embodiments. For ease of understanding, like components of FIGS. 2-6 are indicated by like numerals.

View 610 illustrates the example package assembly after a recess pattern 602 is created on the top surface 218 of the encapsulation (mold compound 208). Specifically, a plurality of recesses 604 may be created on the surface 218 of the mold compound 208, to form the recess pattern 602. The recess pattern 602 may be provided by a mold die tooling (during mold process) or laser ablation process (after mold process). For example, after encapsulation, the top surface 218 of the mold compound 208 may be patterned with a recess using laser ablation. The depth of the pattern 602 and is design may be flexible and easy to modify depending on applications.

Views 620 and 630 illustrate the example package assembly after filling the recess pattern with a material from which the thermal fins may be patterned. In embodiments, the recess pattern 602 may be filled or coated with a bi-metal or shape memory alloy, to dispose the bi-metal or shape memory alloy on the surface of the mold compound; View 620 illustrates an example of a filled 622 or coated 624 recess pattern 602.

In some embodiments, the recess pattern 602 may be filled with a pre-formed shape memory alloy material 632, as shown in view 630. For example, the alloy material 632 may be attached and anchored to the top surface 218, in order to provide for rising of the thermal fins in response to a temperature change as described above. The recess pattern 602 may be further thermally enhanced by filling with metal paste or coating with metal sputter deposition.

View 640 illustrates the example package assembly after patterning the thermal fins from the bi-metal or shape memory alloy disposed on the surface 618 of the mold compound 608. As shown, the fins 214 may be anchored to the surface 618 with a hinge-like arrangement 642, in order to provide a desired flexibility for the thermal fins 214 and enable a rise of the fins 214 in response to a temperature change.

Figure 7:
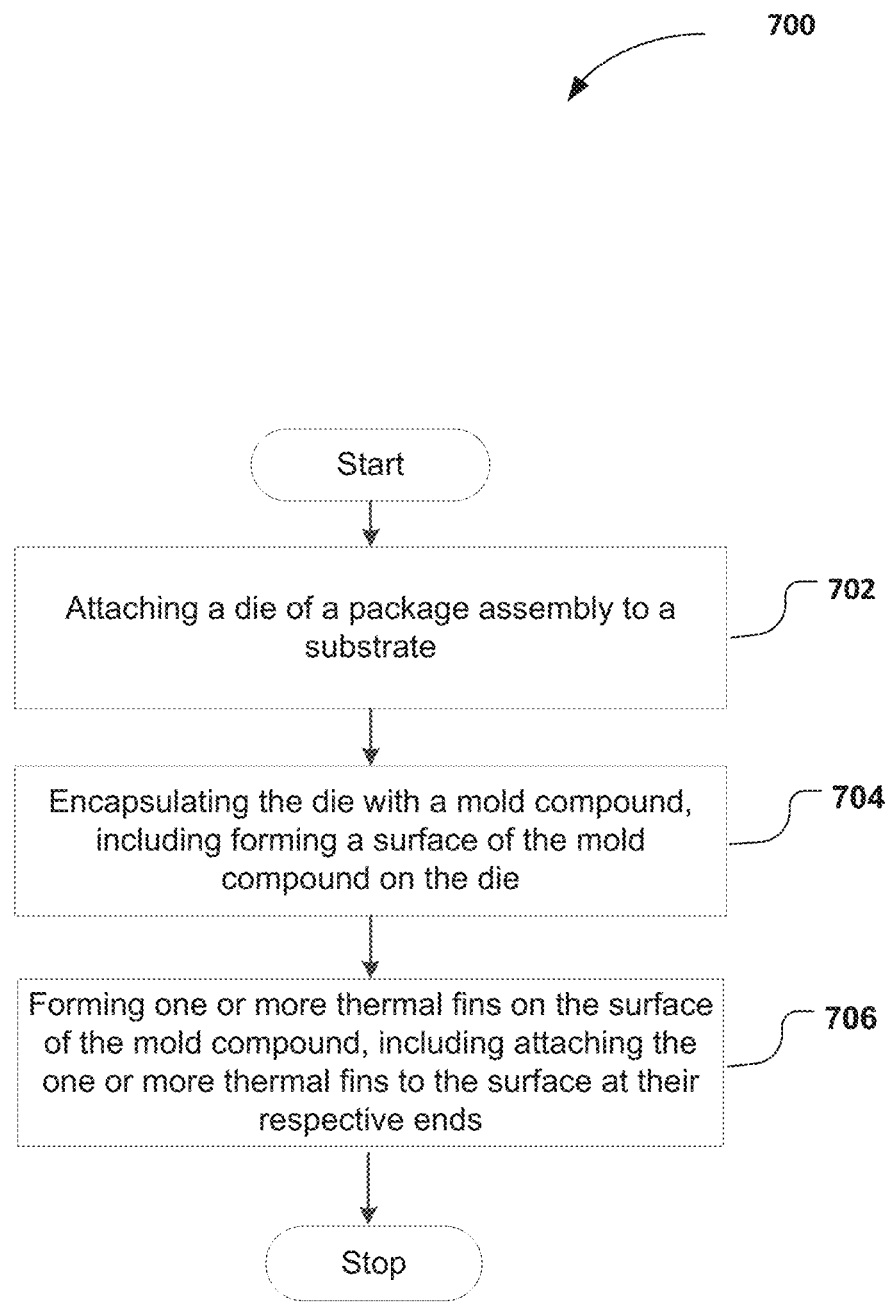
FIG. 7 is an example process flow diagram for providing a package assembly with a thermal solution comprising thermal fins, in accordance with some embodiments.

FIG. 7 is an example process flow diagram for providing a package assembly with a thermal solution comprising thermal fins, in accordance with some embodiments. The process 700 may comport with embodiments described in reference to FIGS. 2-6 of this disclosure.

The process 700 may begin at block 702 and include attaching a die of a package assembly to a substrate.

At block 704, the process 700 may include encapsulating the die with a mold compound, including forming a surface of the mold compound on the die.

At block 706, the process 700 may include forming one or more thermal fins on the surface of the mold compound, including attaching the fins to the surface at their respective ends. The thermal fins may reside substantially flatly on the surface of the mold compound at a temperature of a first value. The thermal fins may rise away from the top surface of the mold compound in response to a change of temperature to a second value, to reach at least a portion of an enclosure that may surround the package assembly, and provide direct heat conductivity between the die and the enclosure. The second temperature value may be greater than the first temperature value. forming one or more thermal fins on the surface of the mold compound may include creating a plurality of recesses on the surface of the mold compound, to form a recess pattern on the surface of the mold compound; filling or coating the plurality of recesses with a bi-metal or shape memory alloy; and patterning the fins from the bi-metal or shape memory alloy disposed on the surface of the mold compound.

Figure 8:
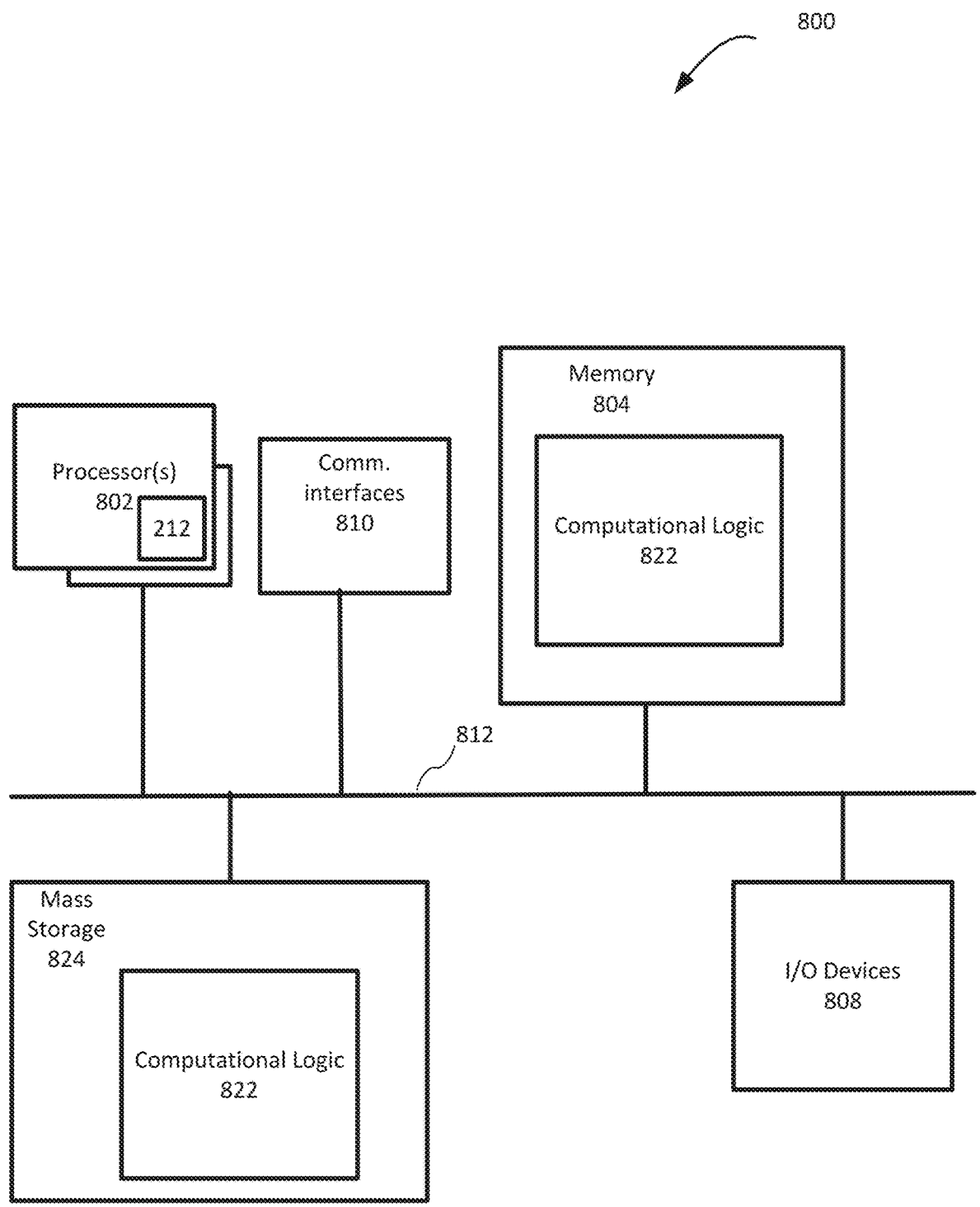
FIG. 8 illustrates an example computing system suitable for use with various components of FIGS. 1-6, in accordance with some embodiments.

FIG. 8 illustrates an example computing system suitable for use with various components of FIGS. 1-6, in accordance with some embodiments. In some embodiments, example computing system 800 may include various components described in reference to FIGS. 1-6.

As shown, computing system 800 may include one or more processors or processor cores 802 and system memory 804. For the purpose of this application, including the claims, the terms "processor" and "processor cores" may be considered synonymous, unless the context clearly requires otherwise. The processor 802 may include any type of processors, such as a central processing unit (CPU), a microprocessor, and the like. The processor 802 may be implemented as an integrated circuit having multi-cores, e.g., a multi-core microprocessor. In embodiments, the processor 802 may be a part of a semiconductor package with the thermal solution 110 or 212 described in reference to FIGS. 1-6.

The computing system 800 may include mass storage devices 824 (such as solid state drives, volatile memory (e.g., dynamic random-access memory (DRAM), and so forth)). In general, system memory 804 and/or mass storage devices 824 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing system 800 may further include input/output (I/O) devices 808 (such as display, soft keyboard, touch sensitive screen, image capture device, and so forth) and communication interfaces 810 (such as network interface cards, modems, infrared receivers, radio receivers (e.g., Near Field Communication (NFC), Bluetooth, WiFi, 4G/5G Long Term Evolution (LTE), and so forth).

The communication interfaces 810 may include communication chips (not shown) that may be configured to operate the device 800 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 810 may operate in accordance with other wireless protocols in other embodiments.

The above-described computing system 800 elements may be coupled to each other via system bus 812, which may represent one or more buses. In the case of multiple buses, they may be bridged by one or more bus bridges (not shown). Each of these elements may perform its conventional functions known in the art. In particular, system memory 804 and mass storage devices 824 may be employed to store a working copy and a permanent copy of the programming instructions implementing firmware, an operating system and/or one or more applications to be executed on computing system.

Computational logic 822 may be implemented in assembler instructions supported by processor(s) 802 or high-level languages that may be compiled into such instructions.

The number, capability, and/or capacity of the elements 808, 810, 812 may vary, depending on whether computing system 800 is used as a mobile computing system, such as a tablet computing system, laptop computer, game console, or smartphone, or a stationary computing system, such as a set-top box or desktop computer. Their constitutions are otherwise known, and accordingly will not be further described.

At least one of processors 802 may be packaged together with memory having computational logic 822 to form a System in Package (SiP) or a System on Chip (SoC). In some embodiments, the processors 802 and/or computational logic 822 may comprise the package assembly 200 with the thermal interface 212, described in detail in reference to FIGS. 2-6.

In various implementations, the computing system 800 may comprise a mobile computing system, such as a smartphone, a tablet, a personal digital assistant (PDA), an ultra mobile personal computer (PC), or any other mobile computing system. In various embodiments, the computing system may comprise a laptop, a netbook, a notebook, or an ultrabook. In further implementations, the computing system 800 may be any other electronic device that processes data.

The embodiments described herein may be further illustrated by the following examples.

Example 1 may be a package assembly, comprising: a die; a mold compound disposed on the die; and one or more thermal fins attached to the mold compound at their respective ends, wherein the one or more thermal fins are disposed substantially flat on a top surface of the mold compound at a first temperature, and rise away from the top surface of the mold compound in response to a temperature change to a second temperature, to provide direct heat conductivity between the die and an enclosure that surrounds the package assembly, wherein the second temperature is greater than the first temperature.

Example 2 may include the package assembly of example 1, further comprising a substrate, wherein the die is disposed on the substrate.

Example 3 may include the package assembly of example 1, wherein the one or more thermal fins comprise a bi-metal or shape memory alloy.

Example 4 may include the package assembly of example 1, wherein the package assembly is free from a thermal interface material between the package assembly and enclosure.

Example 5 may include the package assembly of example 1, wherein the one or more thermal fins are anchored to the top surface of the mold compound using a plating or sputtering technique.

Example 6 may include the package assembly of example 1, wherein the one or more thermal fins are disposed on the top surface of the mold compound in a pattern.

Example 7 may include the package assembly of example 6, wherein the top surface of the mold compound comprises a plurality of recesses that form a recess pattern on the top surface of the mold compound, wherein the recesses are filled or coated with a bi-metal or shape memory alloy, wherein the one or more fins are patterned from the bi-metal or shape memory alloy.

Example 8 may include the package assembly of example 1, wherein the one or more fins comprise a tree-like shape having a stem and a plurality of branches extending out of the stem on each side of the stem, to optimize a surface of heat conduction for the one or more fins.

Example 9 may include the package assembly of example 1, wherein the package assembly comprises a system in package (SiP), wherein the package assembly is coupled with a printed circuit board.

Example 10 may include the package assembly of any of examples 1 to 9, wherein the enclosure comprises a metal or graphite, wherein the one or more thermal fins are to reach the enclosure when rising away from the top surface of the mold compound.

Example 11 may include the package assembly of example 1, wherein the package assembly comprises a computing device.

Example 12 may be a method, comprising: encapsulating a die of a package assembly with a mold compound, including forming a surface of the mold compound on the die; and forming one or more thermal fins on the surface of the mold compound, including attaching the one or more thermal fins to the surface at their respective ends, the one or more thermal fins residing substantially flatly on the surface of the mold compound at a first temperature, and rising away from the top surface of the mold compound to a temperature change to a second temperature, to provide direct heat conductivity between the die and an enclosure that surrounds the package assembly, wherein the second temperature is greater than the first temperature.

Example 13 may include the method of example 12, further comprising: attaching the die to a substrate, prior to encapsulating the die with the mold compound.

Example 14 may include the method of example 12, wherein the forming one or more thermal fins on the mold compound includes: creating a plurality of recesses on the surface of the mold compound, to form a recess pattern on the surface of the mold compound; filling or coating the plurality of recesses with a bi-metal or shape memory alloy, to dispose the bi-metal or shape memory ally on the surface of the mold compound; and patterning the one or more fins from the bi-metal or shape memory alloy disposed on the surface of the mold compound.

Example 15 may include the method of example 14, wherein patterning the one or more fins comprises forming the fins with a tree-like shape having a stem and a plurality of branches extending out of the stem on each side of the stem, to optimize a surface of heat conduction for the one or more fins.

Example 16 may include the method of example 14, further comprising: attaching the die to a printed circuit board (PCB).

Example 17 may include the method of any of examples 12 to 16, wherein the one or more thermal fins are to reach at least a portion of the enclosure.

Example 18 may be a computing system, comprising: an enclosure; a die coupled with a printed circuit board (PCB) inside the enclosure; a mold compound disposed on the die, to encapsulate the die; and one or more thermal fins attached to the mold compound at their respective ends, wherein the one or more thermal fins are disposed substantially flat on a top surface of the mold compound at a first temperature, and rise away from the top surface of the mold compound in response to a temperature change to a second temperature, to provide direct heat conductivity between the die and the enclosure, wherein the second temperature is greater than the first temperature.

Example 19 may include the computing system of example 18, further comprising a substrate attached to the PCB, wherein the die is disposed on the substrate.

Example 20 may include the computing system of example 18, wherein the die comprises a central processing unit.

Example 21 may include the computing system of example 18, wherein the computing system comprises a system in package (SiP).

Example 22 may include the computing system of example 18, wherein the computing system comprises a wireless device.

Example 23 may include the computing system of example 18, wherein the mold compound is to encapsulate the die.

Example 24 may include the computing system of any of examples 18 to 23, wherein the one or more fins are to reach the enclosure when rising away from the top surface of the mold compound.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof

What is claimed is:

1. An apparatus, comprising:
a package assembly; and
an enclosure that surrounds the package assembly, wherein the package assembly includes:
a die;
a mold compound disposed on the die; and
one or more thermal fins attached to the mold compound at an end of the one or more thermal fins, wherein the one or more thermal fins are disposed flat on a top surface of the mold compound at a first temperature, and rise away from the top surface of the mold compound in response to a temperature change to a second temperature, to provide direct heat conductivity between the die and the enclosure that surrounds the package assembly, wherein the second temperature is greater than the first temperature.

2. The apparatus of claim 1, further comprising a substrate, wherein the die is disposed on the substrate.

3. The apparatus of claim 1, wherein the one or more thermal fins comprise a bi-metal or a shape memory alloy.

4. The apparatus of claim 1, wherein the package assembly is free from a thermal interface material between the package assembly and enclosure.

5. The apparatus of claim 1, wherein the one or more thermal fins are anchored to the top surface of the mold compound using a plating or sputtering technique.

6. The apparatus of claim 1, wherein the one or more thermal fins are disposed on the top surface of the mold compound in a pattern.

7. The apparatus of claim 6, wherein the top surface of the mold compound comprises a plurality of recesses that form a recess pattern on the top surface of the mold compound, wherein the recesses are filled or coated with a bi-metal or a shape memory alloy, wherein the one or more fins are patterned from the bi-metal or the shape memory alloy.

8. The apparatus of claim 1, wherein each of the one or more thermal fins comprise a tree-like shape having a stem and a plurality of branches extending out of the stem on each side of the stem, to optimize a surface of heat conduction for the one or more fins.

9. The apparatus of claim 1, wherein the package assembly comprises a system in package (SiP), wherein the package assembly is coupled with a printed circuit board.

10. The apparatus of claim 1, wherein the enclosure comprises a metal or a graphite, wherein the one or more thermal fins are to reach the enclosure when rising away from the top surface of the mold compound.

11. The apparatus of claim 1, wherein the package assembly comprises a computing device.

12. A method, comprising:
encapsulating a die of a package assembly with a mold compound, including forming a surface of the mold compound on the die; and
forming one or more thermal fins on the surface of the mold compound, including attaching the one or more thermal fins to the surface at an end of the one or more thermal fins, the one or more thermal fins residing flatly on the surface of the mold compound at a first temperature, and rising away from the top surface of the mold compound to a temperature change to a second temperature, to provide direct heat conductivity between the die and an enclosure that surrounds the package assembly, wherein the second temperature is greater than the first temperature.

13. The method of claim 12, further comprising: attaching the die to a substrate, prior to encapsulating the die with the mold compound.

14. The method of claim 12, wherein forming the one or more thermal fins on the mold compound includes:
creating a plurality of recesses on the surface of the mold compound, to form a recess pattern on the surface of the mold compound;
filling or coating the plurality of recesses with a bi-metal or a shape memory alloy, to dispose the bi-metal or the shape memory ally on the surface of the mold compound; and
patterning the one or more fins from the bi-metal or shape memory alloy.

15. The method of claim 14, wherein patterning the one or more fins comprises forming each of the fins with a tree-like shape having a stem and a plurality of branches extending out of the stem on each side of the stem, to optimize a surface of heat conduction for the one or more one or more fins.

16. The method of claim 14, further comprising: attaching the die to a printed circuit board (PCB).

17. The method of claim 12, wherein the one or more thermal fins are to reach at least a portion of the enclosure.

18. A computing system, comprising:
an enclosure;
a die coupled with a printed circuit board (PCB) inside the enclosure;
a mold compound disposed on the die; and
one or more thermal fins attached to the mold compound at an end of the one or more thermal fins, wherein the one or more thermal fins are disposed flat on a top surface of the mold compound at a first temperature, and rise away from the top surface of the mold compound in response to a temperature change to a second temperature, to provide direct heat conductivity between the die and the enclosure, wherein the second temperature is greater than the first temperature.

19. The computing system of claim 18, further comprising a substrate attached to the PCB, wherein the die is disposed on the substrate.

20. The computing system of claim 18, wherein the die comprises a central processing unit.

21. The computing system of claim 18, wherein the computing system comprises a system in package (SiP).

22. The computing system of claim 18, wherein the computing system comprises a wireless device.

23. The computing device of claim 18, wherein the mold compound is to encapsulate the die.

24. The computing device of claim 18, wherein the one or more thermal fins are to reach the enclosure when rising away from the top surface of the mold compound.

* * * * *

UNITED STATES PATENT AND TRADEMARK OFFICE
CERTIFICATE OF CORRECTION

PATENT NO. : 10,573,575 B2  
APPLICATION NO. : 15/688662  
DATED : February 25, 2020  
INVENTOR(S) : Kim et al.

Page 1 of 1

It is certified that error appears in the above-identified patent and that said Letters Patent is hereby corrected as shown below:

In the Claims

Column 12
Line 35, "... ally" should read -- ... alloy --

Signed and Sealed this
Ninth Day of June, 2020

Andrei Iancu
*Director of the United States Patent and Trademark Office*